US012614700B2

(12) United States Patent
 Joubert et al.

(10) Patent No.: US 12,614,700 B2
(45) Date of Patent: Apr. 28, 2026

(54) MINIMIZATION OF RING EROSION DURING PLASMA PROCESSES

(71) Applicant: Applied Materials, Inc., Santa Clara, CA (US)

(72) Inventors: Olivier Joubert, Meylan (FR); Olivier Luere, Sunnyvale, CA (US); Vedapuram S. Achutharaman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 16/156,733

(22) Filed: Oct. 10, 2018

(65) Prior Publication Data

US 2019/0043697 A1 Feb. 7, 2019

Related U.S. Application Data

(63) Continuation of application No. 15/335,074, filed on Oct. 26, 2016, now Pat. No. 10,109,464.

(Continued)

(51) Int. Cl.
| | |
|---|---|
| *H01J 37/32* | (2006.01) |
| *C23C 4/00* | (2016.01) |
| *C23C 4/02* | (2006.01) |
| *C23C 4/10* | (2016.01) |
| *C23C 4/134* | (2016.01) |
| *C23C 16/40* | (2006.01) |
| *C23C 16/44* | (2006.01) |
| *H01L 21/3065* | (2006.01) |

(Continued)

(52) U.S. Cl.
CPC .......... *H01J 37/32495* (2013.01); *C23C 4/00* (2013.01); *C23C 4/02* (2013.01); *C23C 4/10* (2013.01); *C23C 4/134* (2016.01); *C23C*

*16/401* (2013.01); *C23C 16/4404* (2013.01); *H01J 37/32477* (2013.01); *H01J 37/32504* (2013.01); *H01J 37/32642* (2013.01); *H01J 37/32715* (2013.01); *H01J 37/32862* (2013.01); *H10P 50/242* (2026.01); *H10P 72/0421* (2026.01); *H10P 72/7606* (2026.01)

(58) Field of Classification Search
None
See application file for complete search history.

(56) References Cited

U.S. PATENT DOCUMENTS

| | | | |
|---|---|---|---|
| 6,036,877 | A | 3/2000 | Collins et al. |
| 6,039,836 | A | 3/2000 | Dhindsa et al. |

(Continued)

OTHER PUBLICATIONS

"Diamond-Like Carbon." Takai et al. See p. 7. Source: https://www.sciencedirect.com/topics/engineering/diamond-like-carbon Retrieved Feb. 8, 2025. (Year: 2025).*

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

A ring assembly for a substrate support is disclosed herein. The ring assembly has a ring shaped body. The ring shaped body has an inner diameter and an outer diameter, a top surface, an inner portion at the inner diameter, and an outer portion at the outer diameter. A carbon based coating is disposed on the top surface of the ring shaped body, wherein the carbon based coating is thicker on the inner portion of the ring shaped body than the outer portion of the ring shaped body.

12 Claims, 3 Drawing Sheets

Related U.S. Application Data

(60) Provisional application No. 62/277,299, filed on Jan. 11, 2016.

(51) Int. Cl.

| | |
|---|---|
| *H01L 21/67* | (2006.01) |
| *H01L 21/687* | (2006.01) |
| *H10P 50/24* | (2026.01) |
| *H10P 72/00* | (2026.01) |
| *H10P 72/76* | (2026.01) |

(56) References Cited

U.S. PATENT DOCUMENTS

| | | | |
|---|---|---|---|
| 6,232,236 B1 | 5/2001 | Shan et al. | |
| 6,676,804 B1 * | 1/2004 | Koshimizu | H01J 37/32642 |
| | | | 156/345.53 |
| 7,204,913 B1 | 4/2007 | Singh et al. | |
| 8,211,324 B2 | 7/2012 | Dhindsa et al. | |
| 8,382,942 B2 * | 2/2013 | Hatamura | H01L 21/67069 |
| | | | 156/345.51 |
| 8,734,664 B2 | 5/2014 | Yang et al. | |
| 8,988,848 B2 | 3/2015 | Todorow et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 2004/0084409 A1 | 5/2004 | Deshmukh et al. | |
| 2007/0029193 A1 | 2/2007 | Brcka | |
| 2008/0206452 A1 * | 8/2008 | Suzuki | H01L 21/67069 |
| | | | 427/140 |
| 2009/0221150 A1 | 9/2009 | Hammond, IV et al. | |
| 2009/0272718 A1 | 11/2009 | Fischer | |
| 2011/0006037 A1 * | 1/2011 | Satoh | C23C 8/36 |
| | | | 216/62 |
| 2012/0247667 A1 * | 10/2012 | Hashiguchi | H01J 37/32477 |
| | | | 156/345.3 |
| 2013/0107415 A1 | 5/2013 | Banna et al. | |
| 2013/0154175 A1 | 6/2013 | Todorow et al. | |
| 2013/0157067 A1 * | 6/2013 | Kawamoto | C04B 41/87 |
| | | | 428/446 |
| 2013/0168020 A1 * | 7/2013 | Hashiguchi | H01J 37/32642 |
| | | | 156/345.51 |
| 2013/0273313 A1 * | 10/2013 | Sun | C23C 4/01 |
| | | | 428/137 |
| 2013/0288483 A1 | 10/2013 | Sadjadi et al. | |
| 2013/0308681 A1 * | 11/2013 | Yamawaku | G01K 11/14 |
| | | | 374/161 |
| 2014/0034239 A1 | 2/2014 | Yang et al. | |
| 2014/0069584 A1 | 3/2014 | Yang et al. | |
| 2016/0343547 A1 * | 11/2016 | Lim | C23C 16/4581 |
| 2017/0018411 A1 | 1/2017 | Sriraman et al. | |
| 2017/0069462 A1 | 3/2017 | Kanarik et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0178917 A1 | 6/2017 | Kamp et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |

* cited by examiner

300

PREFERENTIALLY COAT AN INTERIOR OF A PROCESSING CHAMBER HAVING SIDEWALLS, A SUBSTRATE SUPPORT, AND A PROCESSING RING WHILE NO SUBSTRATE IS PRESENT — 310

ETCH A SUBSTRATE DISPOSED ON THE SUBSTRATE SUPPORT — 320

CLEAN THE INTERIOR OF THE PROCESSING CHAMBER WHILE NO SUBSTRATE IS PRESENT — 330

MINIMIZATION OF RING EROSION DURING PLASMA PROCESSES

CROSS-REFERENCE TO RELATED APPLICATIONS

This application claims benefit of U.S. application Ser. No. 15/335,074, filed Oct. 26, 2016, which claims the benefit of U.S. Provisional Application Ser. No. 62/277,299, filed Jan. 11, 2016, both of which are hereby incorporated by reference in their entireties.

BACKGROUND OF THE DISCLOSURE

Field

The embodiments disclosed herein generally relate to controlling erosion of plasma processing chamber components and etching uniformity of a substrate during plasma processing.

Description of the Background Art

Various semiconductor fabrication processes, such as plasma-assisted etching, physical vapor deposition, and chemical vapor deposition, among others, are often performed in plasma processing chambers in which a semiconductor work piece, such as a substrate, engages with a cover ring during processing. For example in a plasma processing chamber configured for etching a semiconductor substrate, the substrate is mounted on a substrate support pedestal within the processing chamber. The substrate support pedestal includes a metal electrode to which an RF bias may be applied. A plasma is formed from a mixture of process gases provided to the processing chamber. The pressure within the processing chamber is maintained by a pump which also removes by-products from the chamber. A power supply is coupled to the electrode inside the substrate support pedestal so as to produce on the electrode a negative bias voltage relative to the plasma. The bias voltage attracts the charged ions from the plasma to bombard the substrate so as to etch the substrate during processing. Because the electrode is negatively biased, the substrate support pedestal is often called the cathode.

The substrate is positioned inward of the cover ring while supported on the pedestal. Ions from the plasma gas formed in the chamber are biased by the cathode to target the substrate. During etching, the ions from the plasma tend to impact the substrate disposed on the substrate support at an angle normal to the plasma sheath. Over time, process equipment such as the cover ring, tend to erode from the ion bombardment. The erosion of the chamber components introduce contaminants into the chamber environment that substrate defects and shortens the mean time between maintenance as the chamber components must be serviced or replaced. Additionally, the erosion of chamber components may cause the plasma sheath to bend in a manner such that the trajectory of the plasma ions is no longer normal to the substrate. For example, erosion of the cover ring may cause plasma ions to angle toward the side or underside of the substrate, thus contributing to poor processing results, particularly near the edge of the substrate proximate the cover ring.

Therefore there is a need for an improved method for plasma processing of substrates in etch chambers.

SUMMARY

A ring assembly for a substrate support is disclosed herein. The ring assembly has a ring shaped body. The ring shaped body has an inner diameter and an outer diameter, a top surface, an inner portion at the inner diameter, and an outer portion at the outer diameter. A carbon based coating is disposed on the top surface of the ring shaped body, wherein the carbon based coating is thicker on the inner portion of the ring shaped body than the outer portion of the ring shaped body.

BRIEF DESCRIPTION OF THE DRAWINGS

So that the manner in which the above recited features of the embodiments herein are attained and can be understood in detail, a more particular description of the invention, briefly summarized above, may be had by reference to the embodiments thereof which are illustrated in the appended drawings.

Figure 1:
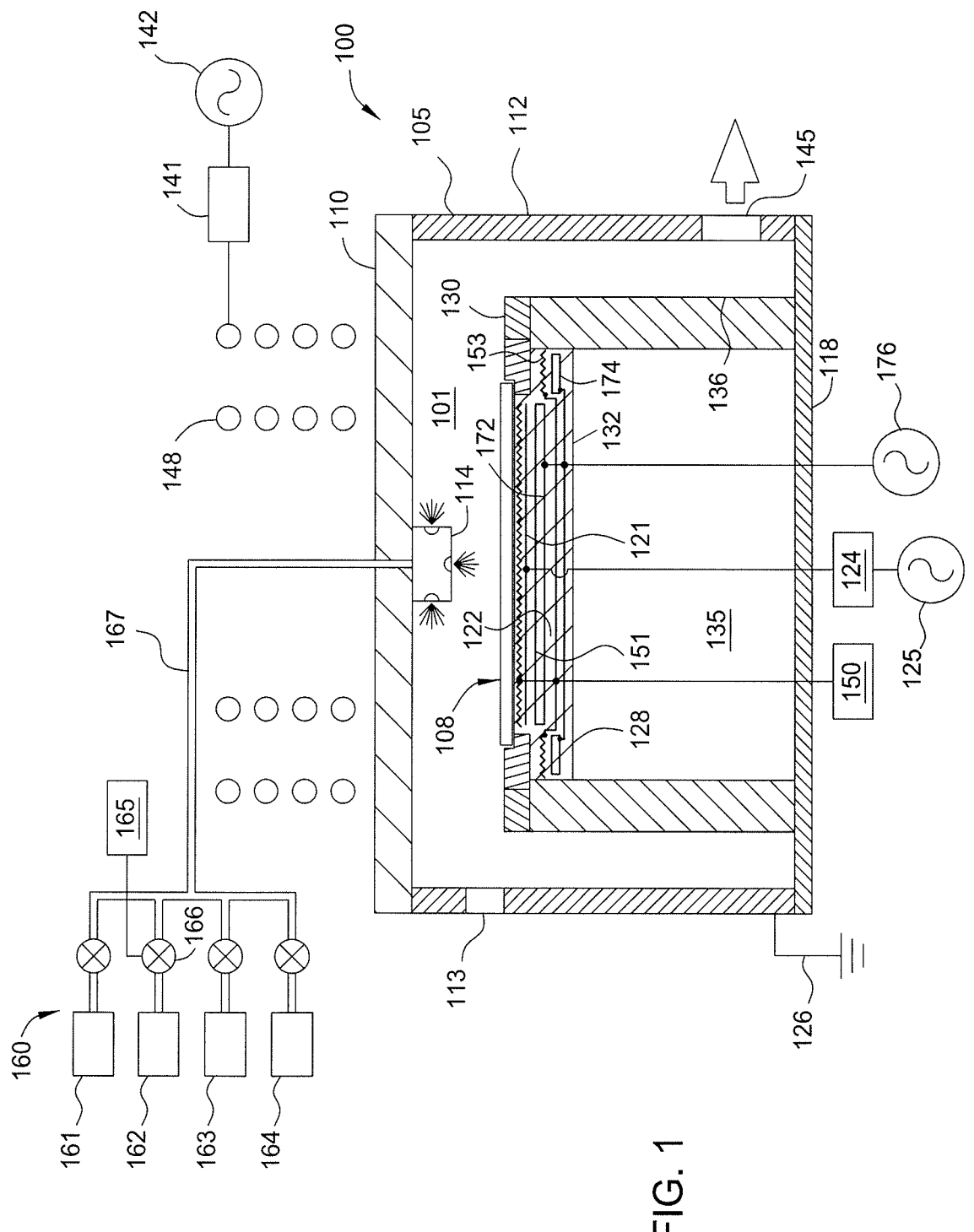
FIG. 1 depicts a plasma processing chamber having a substrate support disposed therein.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide a method for etching a substrate. During the method for etching, a chamber coating is preferentially applied to a cover ring disposed on a substrate support. The preferential application of the coating to the cover ring relative other chamber components extends the life of the cover ring. The coating disposed on the cover ring also promotes process uniformity by maintaining the horizontal consistency of the plasma sheath for consistent process results. Additionally, preferentially coating of the cover ring mitigates both chamber contamination as well as mean times between preventative maintenance.

FIG. 1 illustrates an exemplary processing chamber 100 suitable for etching a substrate therein. The exemplary processing chamber 100 is suitable for removing one or more film layers from the substrate 108. It is contemplated that other process chambers, including those from other manufactures, may be adapted to practice embodiments of the invention.

The processing chamber 100 includes a chamber body 105 having a chamber volume 101 defined therein. The chamber body 105 has sidewalls 112 and a bottom 118, which are coupled to ground 126. The sidewalls 112 have a coating (discussed below in FIG. 2) utilized to protect the sidewalls 112 and extend the time between maintenance cycles of the processing chamber 100. The dimensions of the chamber body 105 and related components of the processing chamber 100 are not limited and generally are proportionally larger than the size of the substrate 108 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 108 into and out of the processing chamber 100. The access port 113 may be coupled to a transfer chamber and/or other chambers of a substrate processing system (not shown).

A pumping port 145 is formed through the sidewall 112 or bottom 118 of the chamber body 105. A pumping device (not shown) is coupled through the pumping port 145 to the chamber volume 101 to evacuate and control the pressure therein. The pumping device may include one or more pumps and throttle valves. In one embodiment, the pumping device enables a vacuum pressure between 10 and 30 mT to be maintained within the chamber volume 101.

A gas panel 160 is coupled by a gas line 167 to the chamber body 105 to supply process gases into the chamber volume 101. The gas panel 160 may include one or more process gas or cleaning gas sources 161, 162, 163, 164 which may include inert gases, non-reactive gases, and reactive gases, if desired. Examples of process gases that may be provided by the gas panel 160 include, but are not limited to, silicon (Si), sulfur (S), fluorine ($F_2$), carbon (C), hydrogen (H), bromine (Br), hydrogen ($H_2$), argon (Ar), chlorine ($Cl_2$), nitrogen ($N_2$), oxygen ($O_2$), combinations thereof or other suitable gases. The gas panel 160 may provide the process gases for etching, deposition or cleaning. For example, the gas panel 160 may provide cleaning gases such as fluorine ($Fl_2$) for cleaning the chamber volume 101 and process gases such as sulfur hexafluoride ($SF_6$) for etching.

Valves 166 control the flow of the process and cleaning gases from the sources 161, 162, 163, 164 from the gas panel 160. Operation of the valves 166 are managed by a controller 165. The flow of the gases supplied to the chamber body 105 from the gas panel 160 may include combinations of the gases. For instance, the process gases $SiCl_4$ and $O_2$ may be supplied into the processing volume to form a protective layer on chamber components inside the processing chamber 100.

The lid assembly 110 may include a nozzle 114. The nozzle 114 has one or more ports for introducing the process and cleaning gases from the gas panel 160 into the chamber volume 101. After the process gases are introduced into the processing chamber 100, the gases are energized to form plasma. An antenna 148, such as one or more inductor coils, may be provided adjacent to the processing chamber 100. An antenna power supply 142 may power the antenna 148 through a match circuit 141 to inductively couple energy, such as RF energy, to the process gas to maintain a plasma formed from the process gas in the chamber volume 101 of the processing chamber 100.

A substrate support 132 is disposed in the chamber volume 101 on a substrate support pedestal 135 to support the substrate 108 during processing. The substrate support pedestal 135 may have a cathode liner 136 to protect the sidewalls of the substrate support pedestal 135 from the plasma gases and to extend the time between maintenance of the processing chamber 100.

A cooling base (not shown) may be provided to assist in controlling the temperature of the substrate 108. To mitigate process drift and time, the temperature of the substrate 108 may be maintained substantially constant by the cooling base throughout the time the substrate 108 is in the etch chamber. In one embodiment, the temperature of the substrate 108 is maintained throughout subsequent etch processes at about 90 degrees Celsius.

The substrate support 132 may have a dielectric body 122. A chucking electrode 121 for holding the substrate 108 during processing may be embedded in the dielectric body 122. The chucking electrode 121 uses electro-static attraction to hold the substrate 108 to the substrate support pedestal 135. The chucking electrode 121 is powered by an RF power supply 125 integrated with a match circuit 124. The RF power supply 125 may provide a RF chucking voltage of about 200 volts to about 2000 volts to the chucking electrode 121.

The substrate support 132 may also include cathode electrodes 151, 153 deposed within the dielectric body 122. The cathode electrodes 151, 153 are coupled to a power source 150 and provide a bias which attracts plasma ions, formed by the process gases in the chamber volume 101, to the substrate support 132 and substrate 108 positioned thereon. The power source 150 may cycle on and off, or pulse, during processing of the substrate 108. The power source 150 may independently operate the cathode electrodes 151, 153. In one embodiment, the power source 150 provides the cathode electrodes 151, 153 with between about 200 Watts to about 1000 Watts of RF power for processing the substrate 108.

The substrate support 132 may include heaters 172, 174 disposed therein and connected to a power source 176, for heating the substrate. The substrate support 132 is configured to perform in the temperature range required by the thermal budget of the device being fabricated on the substrate 108. For example, the substrate support 132 may be configured to maintain the substrate 108 at a temperature of about minus about 25 degrees Celsius to about 500 degrees Celsius for certain embodiments.

A cover ring 130 is disposed on the substrate support 132, along the periphery of the substrate support pedestal 135. The cover ring 130 is configured to promote etching uniformity at the edge of the substrate 108, while shielding the top surface of the substrate support pedestal 135 from the plasma environment inside the processing chamber 100. Lift pins (not shown) are selectively moved through the substrate support pedestal 135 to lift the substrate 108 above the substrate support pedestal 135 to facilitate access to the substrate 108 by a transfer robot (not shown) or other suitable transfer mechanism.

The chamber components exposed to the chamber volume 101 may have a coating thereon to protect the chamber components from erosion. The coating prevents the degradation of the chamber components which in turn affect processes conducted in the chamber volume 101. The coating mitigates erosion of the chamber components such as the sidewall 112 and the cover ring 130. Thus, the coating helps mitigate the introduction of contaminants into the chamber volume 101 and extends the meantime between preventative maintenance.

Figure 2:
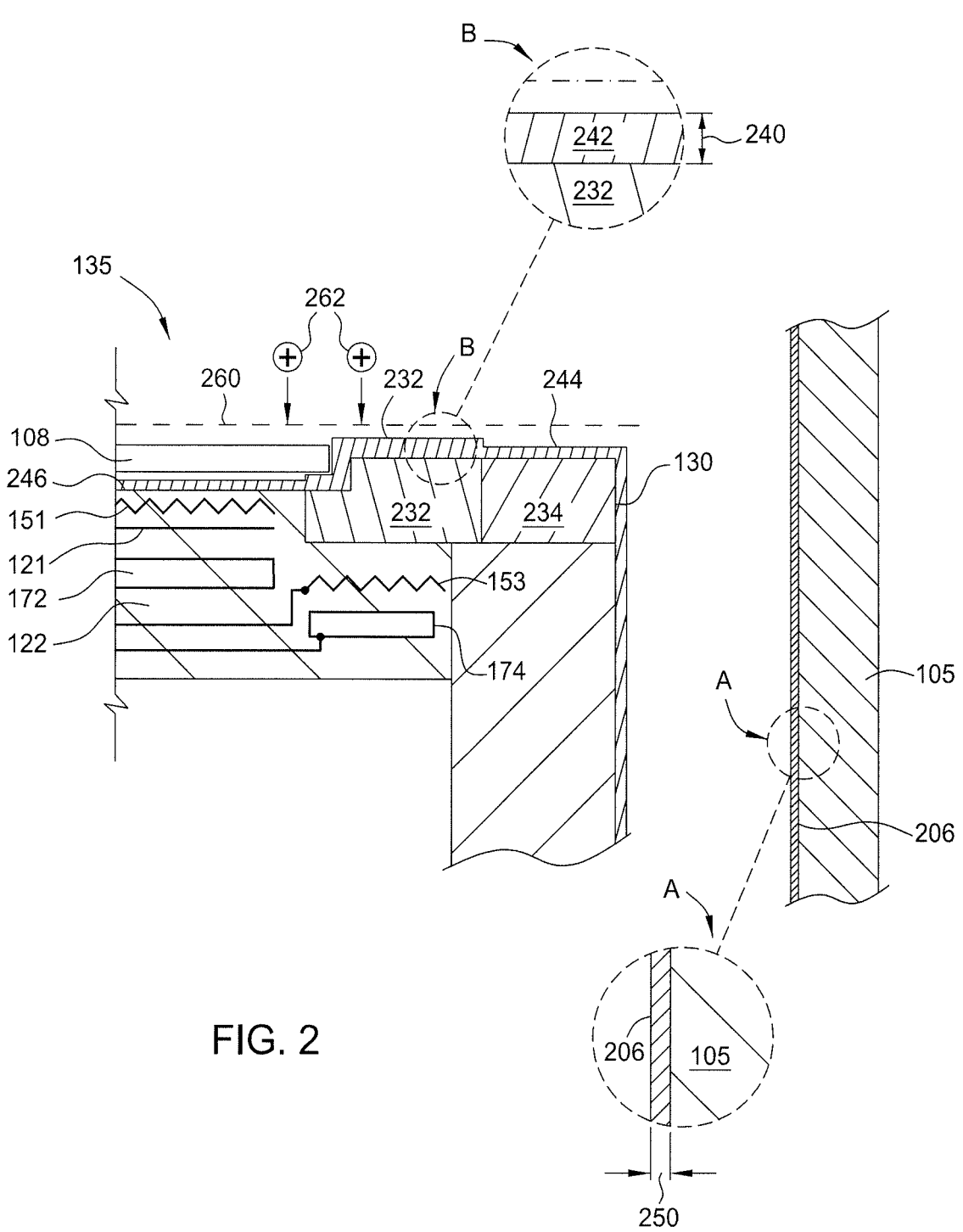
FIG. 2 depicts an enlarged portion of the processing chamber shown in FIG. 1 having a protective coating.

FIG. 2 depicts an enlarged portion of the processing chamber 100 in FIG. 1 illustrating a portion of the substrate support pedestal 135 and a portion of the sidewall 112. The cover ring 130 disposed on the substrate support pedestal 135 may have one or more parts. In one embodiment, the cover ring 130 is a single ring. In another embodiment, the cover ring 130 has an inner ring 232 that abuts an outer ring 234. The inner ring 232 may be formed from a material such as a carbide or silicon (e.g., SiC), quartz, $SiO_x$, or other suitable material. In one embodiment, the inner ring is formed from SiC. The outer ring 234 may similarly be formed from quartz or other suitable material. The inner ring 232 is disposed inside the outer ring 234, distally from the sidewall 112, and configured to closely circumscribe the substrate 118 during processing. As the plasma is centrally located above the substrate 118 during processing, the inner ring 232 is more exposed to the charged ions in the plasma attracted to the substrate 108 undergoing processing then other chamber components including the outer ring 234.

A sheath 260 is formed at the edge of the plasma by positively charged ions 262. The sheath 260 is substantially conformal to the topology of the negatively charged surface, e.g., the substrate support pedestal 135 and/or substrate 108. Wear in the surface of the cover ring 130 and in particular the inner ring 232 may create irregularities or bend the sheath 260. Generally, the charged ions 262 of the plasma move in a direction normal to the sheath 260. Thus, it is advantageous to maintain the sheath 260 perpendicular to some surfaces undergoing processing, such as the top surface of a substrate 108 undergoing etch processing to form deep vias.

A protective coating 242 is provided on the inner ring 232 to mitigate erosion or the inner ring 232 from the plasma ions. The protective coating 242 substantially prevents erosion of the inner ring 232 at the edge of the substrate 108. Thus, the protective coating 242 mitigates bending of the sheath 260 at the outer edge of the substrate 108 and substantially prevents non-uniformity and defects in the substrate 108 along the outer edge of the substrate 108 near the inner ring 232.

Other chamber components also have a protective coating 244, 206. The protective coating 206 disposed on the sidewall 112 and the protective coating 244 disposed on the substrate support pedestal 135 are formed at the same time as the protective coating 242 is formed on the inner ring 232. The coatings 242, 244, 206 may be formed from $SiO_x$, a carbon containing material, such as with $CH_4$ or a fluorocarbon gas, such as $C_4F_6$ or $C_4F_8$, or other suitable material. The coatings 242, 244, 206 may be formed while the processing chamber 100 is under vacuum before the substrate 108 enters the processing chamber 100 for etching. The coatings 242, 244, 206 may be removed while the processing chamber 100 is under vacuum when cleaning the chamber 100. Coating of the processing chamber 100 may be performed after etching a predefined number of substrates, for example one or more, and occurs after the substrate 108 has been removed from the processing chamber 100. This process of forming and removing the coatings 242, 244, 206 is discussed in further detail below in reference to FIG. 3.

Continuing with the discussion of FIG. 2, the protective coating 242 on the inner ring 232 is exposed to more charged ions 262 and thus the protective coating 242 is attacked more aggressively than the other coatings 244, 206 on the other chamber components, including the outer ring 234. The coating 242 is formed in-situ along with and at the same time as the other coatings 244, 206. However, the coating 242 is preferentially formed of a higher quality and/or thickness relative to the coatings 244, 206.

For the Si based coatings, the cathode electrode 153 may independently bias the inner ring 232 relative to the center regions of the substrate support 132. For example, the substrate support 132 and the outer ring 234 may not be biased or have a significantly lower bias than that applied to the inner ring 232. The cathode electrode 153 may create ion energy at the inner ring of about 40 eV to about 100 eV whereas the ion energy at the other chamber components such as that at the outer ring 234 and the substrate support 132 may be about 15 eV or less. Thus, the charged ions of the plasma may be preferentially attracted to the inner ring 232 by the cathode electrode 153 to form the coating 242.

For the carbon based coatings, higher temperatures promote denser films. The density of the carbon based coatings is similar to the density of the $SiO_x$ coatings. Increased bias power does not preferentially increase the quality and/or thickness of carbon based coatings formed on the inner ring 232. Therefore, increasing the temperature of the cover ring 130 increases the quality of the carbon based coatings formed on the inner ring 232 for the carbon based coatings. For example, the power source may supply between about 300 Watts and about 1500 Watts to the heater 174 to increase the temperature of the inner ring 232 to achieve a denser film relative to the carbon based coatings formed on other chamber components.

The result of the preferential formation of the coating 242 is that coating 242 has a thickness 240 which is greater than a thickness 250 of the coating 206 formed on the sidewall 112. The coating 242 is also of a higher density then the other coatings 244, 206. The coating 242 may be about 10 to about 30 times denser than the other coatings 244, 206 formed on the other chamber components. The higher quality of the coating 242 may offer about 10 times to 100 times more etch resistant than the other chamber coatings 244, 206.

During processing, the coating 242 may be more aggressively attacked by the charged ions 262 biased to the substrate 108 relative to the coating 244, 206 present on other chamber components. However, due to the higher quality of the coating 242, the coating 242 is better able to withstand the impact from the charged ions 262 relative to the coatings 244, 206 protecting the other chamber components from erosion by the plasma ions. Advantageously, the coating 242 promotes process uniformity by maintaining the horizontal consistency of the sheath 260 for consistent process results of the substrates 108. Additionally, the coatings 242, 244, 206 improve the meantime between maintenance by significantly reducing erosion of chamber components from the etchants.

Figure 3:
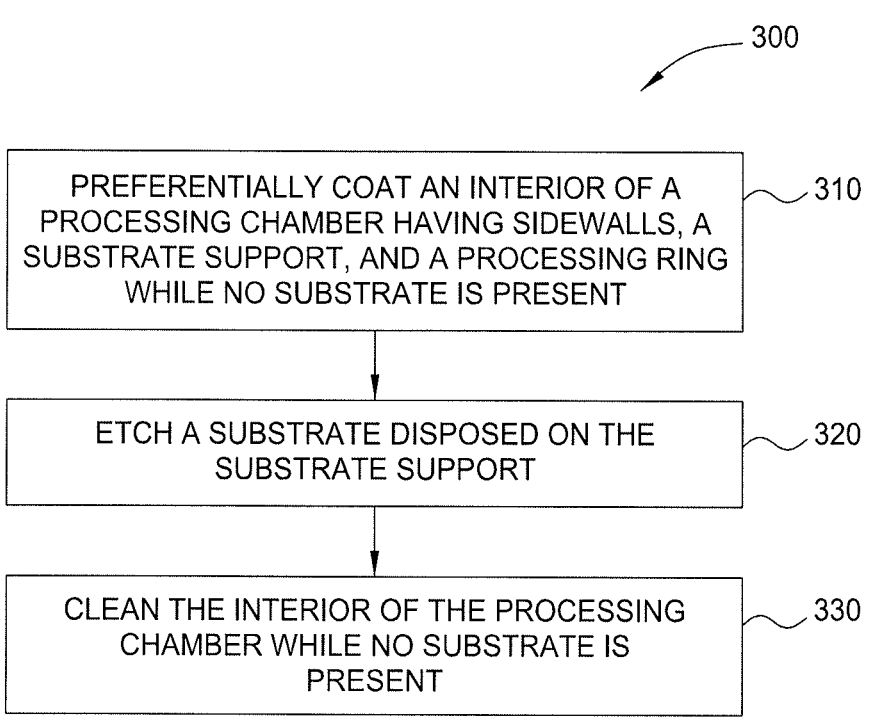
FIG. 3 is a flow diagram of a method for etching a substrate.

FIG. 3 depicts a flow diagram of a method 300 for etching a substrate. The method 300 begins at block 310 by coating an interior of a processing chamber while the processing chamber is maintained under vacuum. There is no substrate present in the processing chamber while the processing chamber is being coated. The processing chamber has sidewalls, a substrate support, and a cover ring. The cover ring is preferentially coated relative to the sidewalls and substrate support.

In one example, the cover ring is preferentially coated relative to the sidewalls and substrate support by biasing the cover ring with a cathode electrode. In another example, the cover ring is preferentially coated relative to the sidewalls and substrate support by biasing the cover ring with a cathode electrode with more bias power relative to a bias power applied to a center region of the substrate support. In this manner, a ring coating is formed which is thicker and denser than a chamber coating formed on other chamber components in the interior of a processing chamber. The etchants come into contact and attack the chamber components. The coating is formed on the cover ring to a thickness selected to prevent the cover ring from being attacked during subsequent etching of the substrate. Biasing the ring coating produces a higher quality coating as well. The ring coating may also be about 10 to about 30 times denser than the coating on other chamber components. Thus, the ring coating may be about 10 times to 100 times more etch resistant than coating disposed on other chamber components.

In one example, $O_2$ and $SiCl_4$ process gasses may be provided to form a $SiO_x$ coating within the processing chamber. A ratio of the $O_2$ to $SiCl_4$ process gasses is maintained below 1. In another example, a carbon based process gas may be supplied to form a carbon based coating within the processing chamber. A power source provides greater than 1000 W for maintaining the plasma in the processing chamber. The power supply may generate up to about 15 eV ion energy.

In some examples, the cover ring has an inner ring and an outer ring. A cathode electrode is disposed along a periphery of the substrate support to provide increased ion energy at the inner ring relative to regions of the substrate support disposed inward of the inner ring. The cathode electrode substantially overlaps vertically with the inner ring and creates ion energy at the inner ring of about 40 eV to about 100 eV. The coating on the inner ring may also be thicker than the coating on the outer ring or the substrate support.

In some embodiments, a dummy wafer may be disposed on the substrate support to prevent the formation of the coating on the region of the substrate support disposed below the substrate during processing. The dummy wafer may be used in those embodiments wherein the substrate support has only a single cathode electrode disposed in body of the substrate support and configured to attract ions to a substrate during processing. The dummy wafer may protect the central area of the substrate support from being coated. The dummy may also be used in embodiments having the cathode electrode disposed along a periphery of the substrate support. In this manner the central area of the substrate support is protected from being coated.

Preferentially coating the cover ring may alternately or additionally include heating the inner ring of the cover ring to a temperature greater than either an outer ring of the cover ring or the other chamber component. The coating preferentially forms on the higher temperature of the inner ring.

In another example wherein carbon based coatings are formed, the cover ring may be preferentially heated relative to other chamber component to produce a higher quality and/or thickness coating on the cover ring relative to other chamber components. In one example, the inner ring of the cover ring may be heated to a temperature greater than at least one or more of the outer ring, the center region of the substrate support that is disposed inward of the cover ring or the other chamber component.

In a second block 320 of the method 300, a substrate disposed on the substrate support of the processing chamber is etched in the presence of the coated cover ring. The substrate is moved into the processing chamber and placed on the substrate support by a robot or through another manner. Etchants may be introduced into the chamber for selectively removing material from the substrate. In one embodiment, HBr and $O_2$ processes gases are introduced into the interior volume of the chamber to form reactive species (etchants) for etching a feature, such as a trench or via, into the substrate. Process parameters dictate the formation of the features in the substrate. The coating protecting the chamber components must be able to withstand the etchants until the completion of the features formed during the process cycle. The etchants come into contact and attack chamber components. However, the etchants are biased toward the substrate and attack those chamber components closest to the substrate, such as the inner ring, more aggressively. Thus, the higher quality and thickness of the coating on the inner ring is selected to protect the inner ring from damage while the substrate is etched. In some embodiments, the coating formed at block 310 is SiC when a dielectric material is etched at block 320. In some embodiments, the coating formed at block 310 is a carbon based coating when a conductive material or silicon is etched at block 320.

In a third block 330 of the method 300, the interior of the processing chamber is cleaned while the processing chamber remains under vacuum. Cleaning may be performed between etching of each substrate or after etching a number of substrates. The substrate is not present in the interior of the processing chamber while the processing chamber is cleaned. The substrate is removed from the processing chamber by a robot or other manner. A cleaning gas, such as fluorine (Fl), chlorine (Cl) or a derivative thereof, may be introduced into the processing chamber for removing contaminants as well as the coating from the chamber components such as the walls and the cover ring. The material and byproducts removed from the chamber components by the cleaning gas may be pumped out of the chamber by the vacuum.

After cleaning the chamber, the method 300 may repeat the processes described at block 310, block 320 and block 330. In some embodiments, the processes described at block 310 are performed prior to etching a subsequent substrate. In this manner, the chamber may be cleaned of potential contaminants prior to the processing for each substrate. Additionally, the chamber components can be re-coated to prevent wear and erosion. Thus, extending the mean time between preventative maintenance and the bringing the processing equipment offline. The benefit achieved by both these advantages translates to overall higher quality and throughput while generating overall cost savings in fabrication.

While the foregoing is directed to embodiments of the present invention, other and further embodiments of the invention may be devised without departing from the basic scope thereof, and the scope thereof is determined by the claims that follow:

What is claimed is:

1. A process kit ring for a substrate support of a plasma etch chamber, the ring comprising:
    a first ring having a first ring shaped body having a first inner diameter and a first outer diameter, the first ring shaped body comprising:
        a step along the first inner diameter; and
        a first top surface having a first inner top surface on the step and a first outer top surface extending from the first outer diameter to the step, wherein a first vertical surface of the step connects the first inner top surface to the first outer top surface;
    a second ring having a second ring shaped body having a second inner diameter and a second outer diameter, wherein the second inner diameter abuts the first outer diameter of the first ring, the second ring shaped body comprising:
        a second top surface extending from the second inner diameter to the second outer diameter, wherein the second top surface is configured to be coplanar with the first outer top surface; and
    a carbon based coating disposed in contact with the first ring and the second ring, wherein the carbon based coating disposed on the first top surface is thicker and denser than the carbon based coating disposed on the second top surface.

2. The process ring of claim 1, wherein the first ring shaped body is formed from a silicon containing material and the second ring shaped body is formed from quartz.

3. The process ring of claim 1, wherein the carbon based coating on the first top surface is about 10 times to about 30 times denser than the carbon based coating formed on the second top surface.

4. The process ring of claim 1, wherein the first ring shaped body is separable from the second ring shaped body.

5. The process ring of claim 1, wherein the carbon based coating is formed from process gasses comprising $O_2$ and $SiCl_4$.

6. The process ring of claim 1, wherein the first ring shaped body further comprises:

a bottom surface, wherein the bottom surface does not have the carbon based coating.

7. A substrate support for a plasma etch chamber, the substrate support comprising:

a support body, the support body having a top surface suitable for supporting a substrate thereon;

an electrode disposed in the support body;

an edge ring disposed on the top surface of the support body, the edge ring further comprising:

a first ring having a first ring shaped body having a first inner diameter and a first outer diameter, the first ring shaped body comprising:

a step along the first inner diameter; and a first top surface having a first inner top surface on the step and a first outer top surface extending from the first outer diameter to the step, wherein a first vertical surface of the step connects the first inner top surface to the first outer top surface;

a second ring having a second ring shaped body having a second inner diameter and a second outer diameter, wherein the second inner diameter abuts the first outer diameter of the first ring, the second ring shaped body comprising:

a second top surface extending from the second inner diameter to the second outer diameter, wherein the second top surface is configured to be coplanar with the first outer top surface; and a carbon based coating disposed in contact with the first ring and the second ring, wherein the carbon based coating disposed on the first top surface is thicker and denser than the carbon based coating disposed on the second top surface.

8. The substrate support of claim 7, wherein the first ring shaped body is formed from a silicon containing material and the second ring shaped body is formed from quartz.

9. The substrate support of claim 7, wherein the carbon based coating on the first top surface is about 10 times to about 30 times denser than the carbon based coating formed on the second top surface.

10. The substrate support of claim 7, wherein the first ring shaped body is separable from the the second ring shaped body.

11. The substrate support of claim 7, wherein the carbon based coating is formed from process gasses comprising $O_2$ and $SiCl_4$.

12. The substrate support of claim 7, wherein the first ring shaped body further comprises:

a lip disposed on the inner portion and configured to support a substrate thereon; and a bottom surface extending across both the inner portion and the outer portion of the first ring shaped body, wherein the lip has the carbon based coating disposed thereon and the bottom surface does not have the carbon based coating.

*    *    *    *    *